US009130101B2

(12) United States Patent
Fujita et al.

(10) Patent No.: US 9,130,101 B2
(45) Date of Patent: Sep. 8, 2015

(54) SEMICONDUCTOR DEVICE AND METHOD FOR MANUFACTURING SEMICONDUCTOR DEVICE

(75) Inventors: Kenji Fujita, Osaka (JP); Yasushi Funakoshi, Osaka (JP); Hiroyuki Oka, Osaka (JP); Satoshi Okamoto, Osaka (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 56 days.

(21) Appl. No.: 13/699,397

(22) PCT Filed: May 13, 2011

(86) PCT No.: PCT/JP2011/061051
§ 371 (c)(1),
(2), (4) Date: Nov. 21, 2012

(87) PCT Pub. No.: WO2011/145521
PCT Pub. Date: Nov. 24, 2011

(65) Prior Publication Data
US 2013/0069209 A1    Mar. 21, 2013

(30) Foreign Application Priority Data
May 21, 2010    (JP) .................................. 2010-117465

(51) Int. Cl.
| H01L 21/22 | (2006.01) |
| H01L 31/068 | (2012.01) |
| B24B 27/06 | (2006.01) |
| H01L 31/18 | (2006.01) |
| H01L 31/0224 | (2006.01) |

(52) U.S. Cl.
CPC ........ *H01L 31/0682* (2013.01); *B24B 27/0633* (2013.01); *H01L 31/022441* (2013.01); *H01L 31/1804* (2013.01); *Y02E 10/547* (2013.01)

(58) Field of Classification Search
CPC ..... H01L 31/0406; Y02E 10/50; Y02E 10/52; H02N 6/00; G21H 1/12
USPC .................................................. 136/243–265
See application file for complete search history.

(56) References Cited

U.S. PATENT DOCUMENTS

| 3,009,841 | A | 11/1961 | Faust, Jr. |
| 3,396,456 | A * | 8/1968 | Weinstein ..................... 438/565 |
| 2007/0151598 | A1* | 7/2007 | De Ceuster et al. .......... 136/256 |
| 2009/0142911 | A1 | 6/2009 | Asano et al. |
| 2010/0252017 | A1 | 10/2010 | Kitagawa et al. |

FOREIGN PATENT DOCUMENTS

| JP | 56-130914 A | 10/1981 |
| JP | 2005-310830 | 11/2005 |

(Continued)

OTHER PUBLICATIONS

International Search Report for PCT/JP2011/061051, mailed Aug. 30, 2011.

(Continued)

*Primary Examiner* — Cuong Q Nguyen
*Assistant Examiner* — Nishath Yasmeen
(74) *Attorney, Agent, or Firm* — Nixon & Vanderhye P.C.

(57) ABSTRACT

A semiconductor device and a method for manufacturing the semiconductor device are provided. A semiconductor substrate has a surface on which an abrasion trace is formed, and a dopant diffusion region includes a portion extending in the direction at an angle within the range of −5° to +5° with respect to the direction in which the abrasion trace extends.

4 Claims, 15 Drawing Sheets

(56) References Cited

FOREIGN PATENT DOCUMENTS

| JP | 2007-49079 | | 2/2007 | | |
| JP | 2008147660 | A * | 6/2008 | ............ | H01L 21/225 |
| JP | 2009-142912 | | 7/2009 | | |
| JP | 2009-152622 | | 7/2009 | | |
| WO | WO 2009/041266 | | 4/2009 | | |

OTHER PUBLICATIONS

Hou et al., "Experiment research to cut crystal silicon using diamond wire saw," *Diamond & Abrasives Engineering*, Oct. 31, 2007, Serial 161, No. 5, 14-16 (w/ partial translation).

Office Action issued in Chinese Patent Application No. 201180030241.5 dated Dec. 30, 2014 (w/ partial translation).

* cited by examiner (a)

(b)

(a)

(b)

(a)

(b)

(a)

(b)

←120μm→

(a)

(b)

(a)

(b)

SEMICONDUCTOR DEVICE AND METHOD FOR MANUFACTURING SEMICONDUCTOR DEVICE

This application is the U.S. national phase of International Application No. PCT/JP2011/061051, filed 13 May 2011, which designated the U.S. and claims priority to Japan Application No. 2010-117465, filed 21 May 2010, the entire contents of each of which are hereby incorporated by reference.

TECHNICAL FIELD

The present invention relates to a semiconductor device and a method for manufacturing the semiconductor device.

BACKGROUND ART

In recent years, from the viewpoint of global environmental problems, such as a problem of the exhaustion of energy resources and an increase in $CO_2$ in the atmosphere, clean energy has been desired to be developed. Solar photovoltaic power generation using, in particular, solar cells out of semiconductor devices has been developed and put into practical use as a new energy source, and is now on the way to progress.

A double-sided electrode type solar cell has been a conventional mainstream solar cell, which includes for example a monocrystalline or polycrystalline silicon substrate having a light receiving surface having an impurity of a conduction type opposite to that of the silicon substrate diffused therein to provide a pn junction, and electrodes provided at the light receiving surface of the silicon substrate and a surface opposite to the light receiving surface, respectively. In the double-sided electrode type solar cell, it is also generally done to diffuse an impurity of the same conduction type as the silicon substrate in the silicon substrate at the back surface at a high concentration to provide high output by a back surface field effect.

Research and development have also been advanced also about back electrode type solar cells, in each of which an electrode is not formed on the light-receiving surface of a silicon substrate and is formed only on the back surface thereof (see, for example, Patent Literature 1 (Japanese Patent Laying-Open No. 2007-049079)).

Referring to schematic cross-sectional views in FIGS. 28(a) to 28(f), an example of a method for manufacturing a conventional back electrode type solar cell will be hereinafter described.

First, as shown in FIG. 28(a), after masking paste 102 is screen-printed on the entire surface of an n-type or p-type conductive semiconductor substrate 101 on the light receiving surface side and then dried, masking paste 102 is screen-printed on the surface of semiconductor substrate 101 on the back surface side so as to have an opening 114 partially provided therein.

Then, as shown in FIG. 28(b), an n-type dopant 104 is diffused through opening 114 in the back surface of semiconductor substrate 101, thereby forming an n-type dopant diffusion region 103.

Then, masking paste 102 of semiconductor substrate 101 on each of the light receiving surface side and the back surface side is entirely removed. As shown in FIG. 28(c), after masking paste 102 is again screen-printed on the entire surface of semiconductor substrate 101 on the light receiving surface side and then dried, masking paste 102 is screen-printed on the surface of semiconductor substrate 101 on the back surface side so as to have an opening 115 partially provided therein.

Then, as shown in FIG. 28(d), a p-type dopant 106 is diffused through opening 115 in the back surface of semiconductor substrate 101, thereby forming a p-type dopant diffusion region 105.

Then, as shown in FIG. 28(e), after a textured structure 108 is formed by texture-etching of the surface of semiconductor substrate 101 on the light receiving surface side, an antireflection film 109 is formed on textured structure 108 while a passivation film 107 is formed on the back surface side of semiconductor substrate 101.

Then, as shown in FIG. 28(f), after passivation film 107 on the back surface of semiconductor substrate 101 is provided with an opening through which each surface of n-type dopant diffusion region 103 and p-type dopant diffusion region 105 is exposed, an electrode for n type 112 and an electrode for p type 113 are formed that are in contact with n-type dopant diffusion region 103 and p-type dopant diffusion region 105, respectively. In this way, the conventional back electrode type solar cell is produced.

CITATION LIST

Patent Literature

PTL 1: Japanese Patent Laying-Open No. 2007-049079

SUMMARY OF INVENTION

Technical Problem

The conventional back electrode type solar cell, however, causes a problem that n-type dopant diffusion region 103 and p-type dopant diffusion region 105 cannot be formed in their respective prescribed regions, so that excellent characteristics cannot be achieved with stability.

The above-described problem occurs not only in the back electrode type solar cell but also, as a whole, in the semiconductor device including a solar cell such as a double-sided electrode type solar cell.

In light of the above-described circumstances, the present invention aims to provide a semiconductor device capable of achieving excellent characteristics with stability, and a method for manufacturing the semiconductor device.

Solution to Problem

The present invention provides a semiconductor device including a semiconductor substrate; and a dopant diffusion region provided in one surface of the semiconductor substrate. The semiconductor substrate has an abrasion trace formed on the surface thereof. The dopant diffusion region has a portion extending in a direction at an angle within a range of −5° to +5° with respect to a direction in which the abrasion trace extends.

According to the semiconductor device of the present invention, it is preferable that the dopant diffusion region includes an n-type dopant diffusion region and a p-type dopant diffusion region, and the semiconductor device further includes an electrode for n type disposed on the n-type dopant diffusion region and an electrode for p type disposed on the p-type dopant diffusion region.

Furthermore, the present invention provides a method for manufacturing a semiconductor device. The method includes the steps of: forming an abrasion trace extending in one direction on a surface of a semiconductor substrate; placing, on a part of the surface of the semiconductor substrate, masking paste having a portion extending in a direction at an angle within a range of −5° to +5° with respect to a direction in which the abrasion trace extends; and forming a dopant diffusion region in a surface of the semiconductor substrate exposed from the masking paste.

According to the method for manufacturing a semiconductor device of the present invention, it is preferable that the step of forming the abrasion trace includes the step of cutting a semiconductor crystal ingot by a wire saw.

Furthermore, it is preferable that the method for manufacturing a semiconductor device of the present invention includes the step of etching the surface of the semiconductor substrate between the step of forming the abrasion trace and the step of placing the masking paste.

Advantageous Effects of Invention

The present invention can provide a semiconductor device capable of achieving excellent characteristics with stability, and a method for manufacturing the semiconductor device.

DESCRIPTION OF EMBODIMENTS

Figure 1:
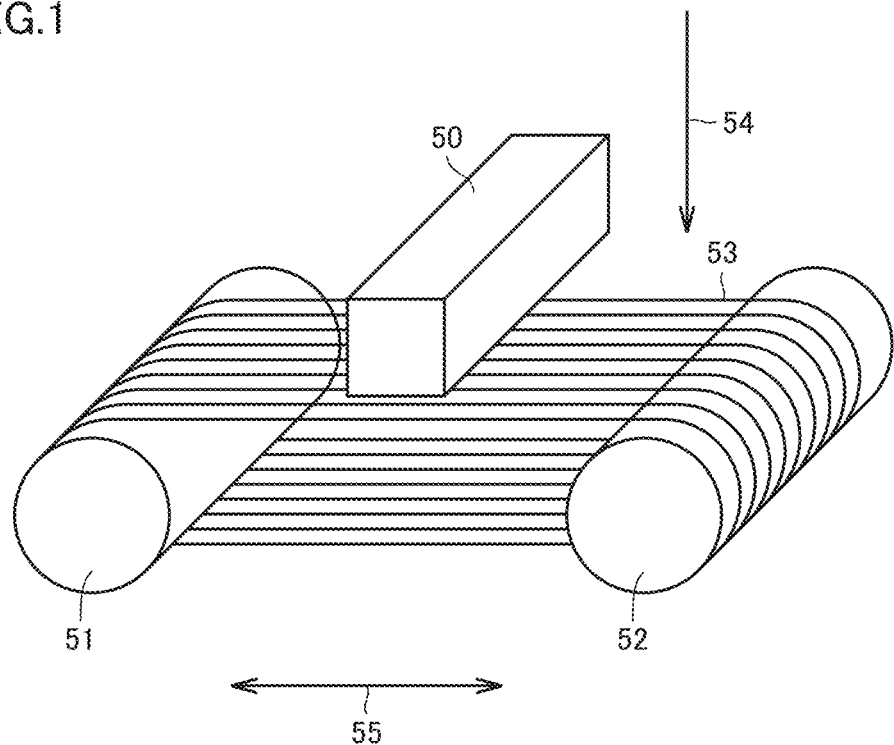
FIG. 1 is a schematic perspective view showing an example of the step of cutting a semiconductor crystal ingot by a wire saw.
Figure 2:
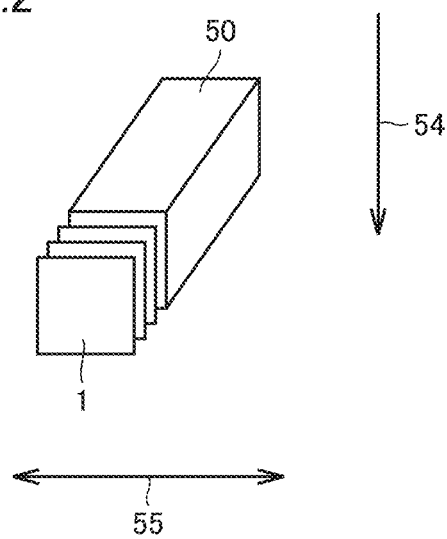
FIG. 2 is a schematic perspective view showing an example of the step of cutting the semiconductor crystal ingot at a plurality of positions and into a plurality of pieces of semiconductor substrates.

Referring to FIGS. 1 to 17, explained will be a method for manufacturing a back electrode type solar cell in an embodiment that is an example of the method for manufacturing a semiconductor device according to the present invention. In the accompanying drawings of the present invention, the same or corresponding components are designated by the same reference characters. First, as shown in the schematic perspective view in FIG. 1, the step of cutting a semiconductor crystal ingot 50 by a wire saw 53 is performed. As shown in FIG. 1, wire saw 53 is wound across between guide rollers 51 and 52 that are disposed at a prescribed distance from each other. This brings about the state where wire saw 53 is tensioned by guide rollers 51 and 52 at a plurality of positions that are at a prescribed distance from one another in the longitudinal direction of each of guide rollers 51 and 52. In this state, guide rollers 51 and 52 repeatedly rotate in the normal direction and in the reverse direction, so that wire saw 53 reciprocates in the direction shown by an arrow 55.

Semiconductor crystal ingot 50 is moved in the direction shown by an arrow 54 while wire saw 53 is reciprocating in the direction shown by arrow 55. Then, semiconductor crystal ingot 50 is pressed against reciprocating wire saw 53, thereby cutting semiconductor crystal ingot 50 at a plurality of positions and into a plurality of pieces of semiconductor substrates 1, for example, as shown in the schematic perspective view in FIG. 2.

Figure 3:
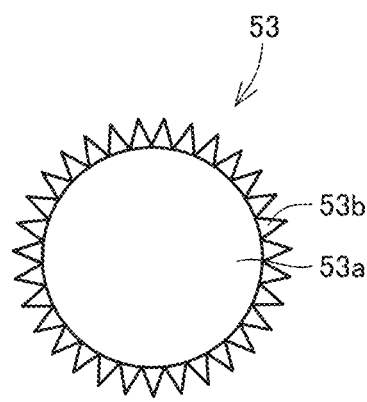
FIG. 3 is a schematic cross-sectional view of an example of the wire saw shown in FIG. 1.

FIG. 3 shows a schematic cross-sectional view of an example of wire saw 53 shown in FIG. 1. In this case, wire saw 53 includes a core wire 53a and an abrasive grain 53b bonded to the outer circumferential surface of core wire 53a with the bond material (not shown). Core wire 53a may be made, for example, of a piano wire and the like. Abrasive grain 53b may be made, for example, of a diamond abrasive grain and the like. The bond material may be made, for example, of nickel and the like that is plated on the outer surface of core wire 53a.

Figure 4:
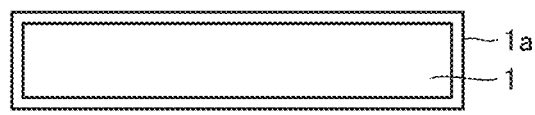
FIG. 4 is a schematic cross-sectional view of an example of the semiconductor substrate obtained by cutting the semiconductor crystal ingot by the wire saw shown in FIG. 1.

FIG. 4 shows a schematic cross-sectional view of an example of a semiconductor substrate 1 obtained by cutting semiconductor crystal ingot 50 by wire saw 53. In this case, the surface of semiconductor substrate 1 undergoes slice damage 1a that is caused by cutting semiconductor crystal ingot 50 using the above-described wire saw 53.

Examples of semiconductor crystal ingot 50 may be a crystal silicon ingot such as a single crystal silicon ingot produced by the Czochralski method or a polycrystal silicon ingot produced by the casting method. When a crystal silicon ingot is used as semiconductor crystal ingot 50, a silicon crystal substrate can be obtained as semiconductor substrate 1. It is to be noted that semiconductor crystal ingot 50 has an n-type conductivity by an n-type dopant doped therein.

Figure 5:
FIG. 5 is a schematic cross-sectional view showing an example of the step of removing slice damage on the surface of the semiconductor substrate shown in FIG. 4.

Then, as shown in the schematic cross-sectional view in FIG. 5, the step of removing slice damage 1a on the surface of semiconductor substrate 1 shown in FIG. 4 is performed. In this case, when a silicon crystal substrate is used as semiconductor substrate 1, slice damage 1a can be removed, for example, by etching with an alkaline aqueous solution such as a sodium hydroxide aqueous solution or a potassium hydroxide aqueous solution.

The size and the shape of semiconductor substrate 1 are not particularly limited, but semiconductor substrate 1 may have a quadrangular surface, for example, having a thickness of 100 μm or more and 300 μm or less and having a side of 100 mm or more and 200 mm or less in length.

Figure 6:
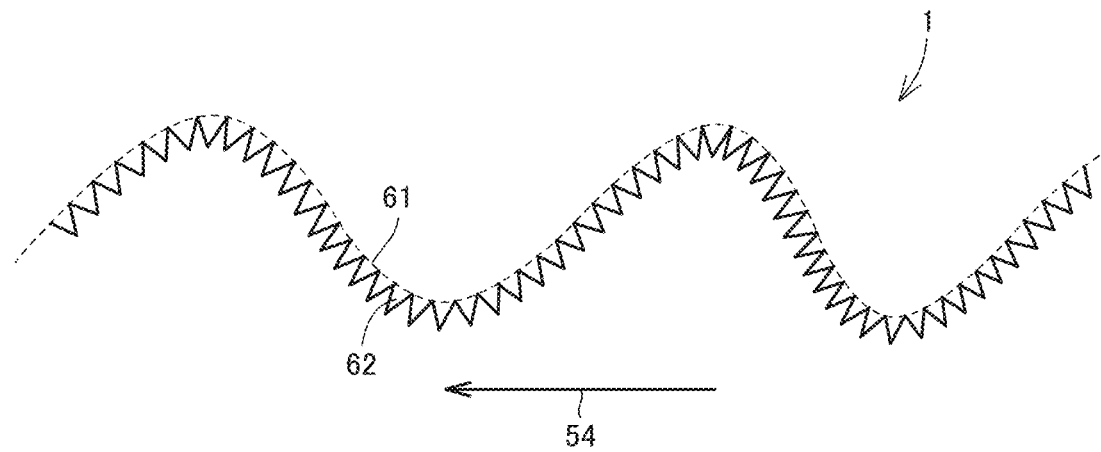
FIG. 6 is a schematic enlarged cross-sectional view of an example of a part of the surface of the semiconductor substrate shown in FIG. 5.
Figure 7:
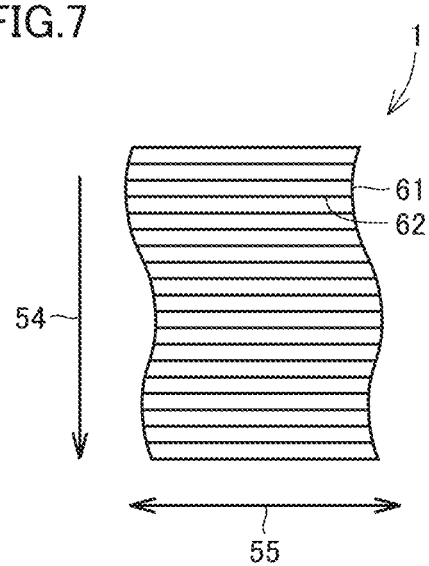
FIG. 7 is a schematic perspective view of an example of a part of the surface of the semiconductor substrate shown in FIG. 5.
Figure 8:
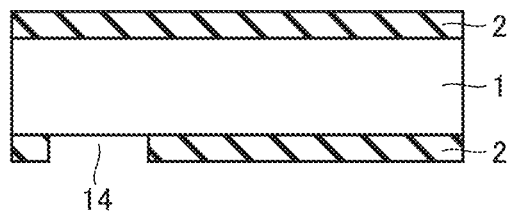
FIG. 8(a) is a schematic cross-sectional view showing an example of the step of placing masking paste on the front surface of the semiconductor substrate.
FIG. 8(b) is a schematic plan view showing an example of the step of placing the masking paste on the back surface of the semiconductor substrate.
Figure 8:
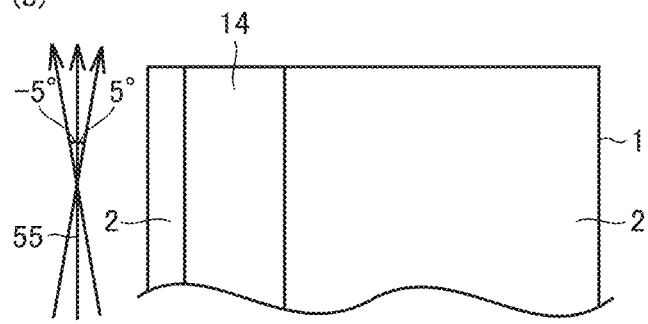
Figure 9:
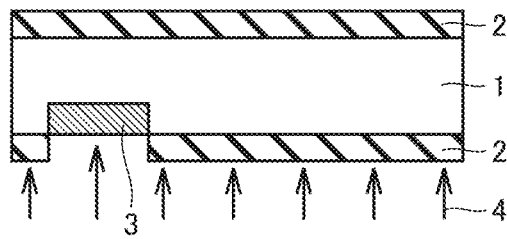
FIGS. 9(a) and 9(b) are a schematic cross-sectional view and a schematic plan view, respectively, each showing an example of the step of forming an n-type dopant diffusion region in the back surface of the semiconductor substrate.
Figure 9:
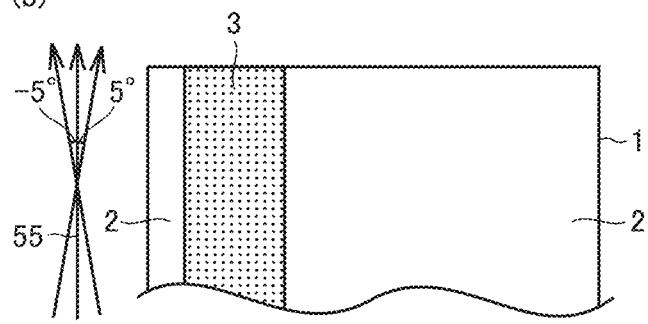
Figure 10:
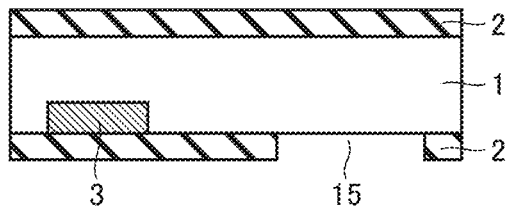
FIG. 10(a) is a schematic cross-sectional view showing an example of the step of placing the masking paste on the front surface of the semiconductor substrate.
FIG. 10(b) is a schematic plan view showing an example of the step of placing the masking paste on the back surface of the semiconductor substrate.
Figure 10:
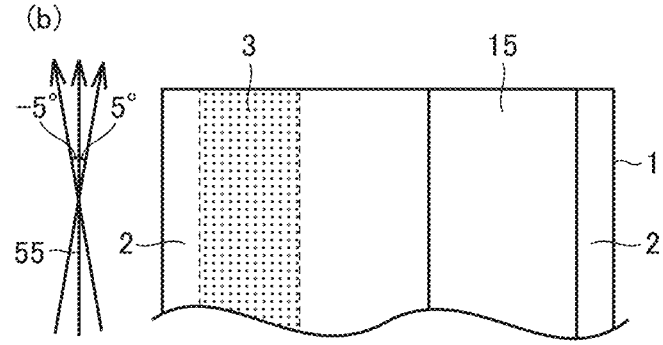
Figure 11:
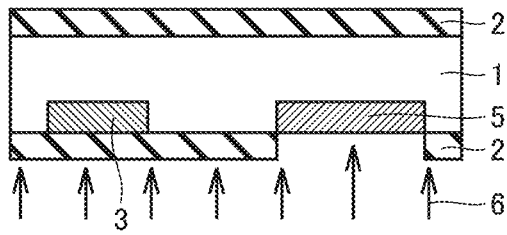
FIGS. 11(a) and 11(b) are a schematic cross-sectional view and a schematic plan view, respectively, each showing an example of the step of forming a p-type dopant diffusion region in the back surface of the semiconductor substrate.
Figure 11:
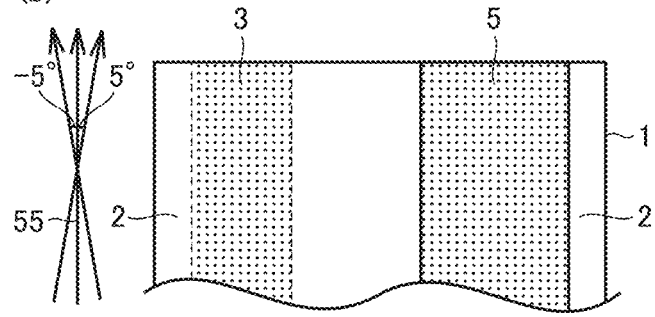
Figure 12:
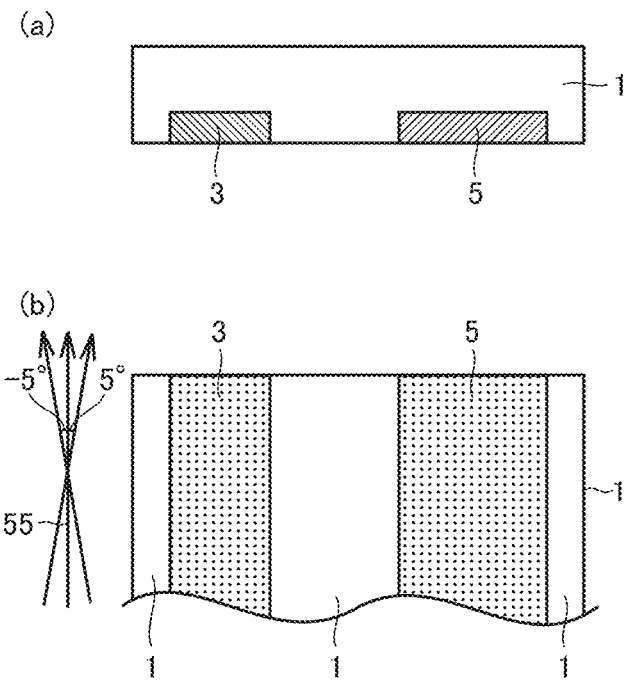
FIGS. 12(a) and 12(b) are a schematic cross-sectional view and a schematic plan view, respectively, each showing an example of the step of exposing the n-type dopant diffusion region and the p-type dopant diffusion region in the back surface of the semiconductor substrate.
Figure 13:
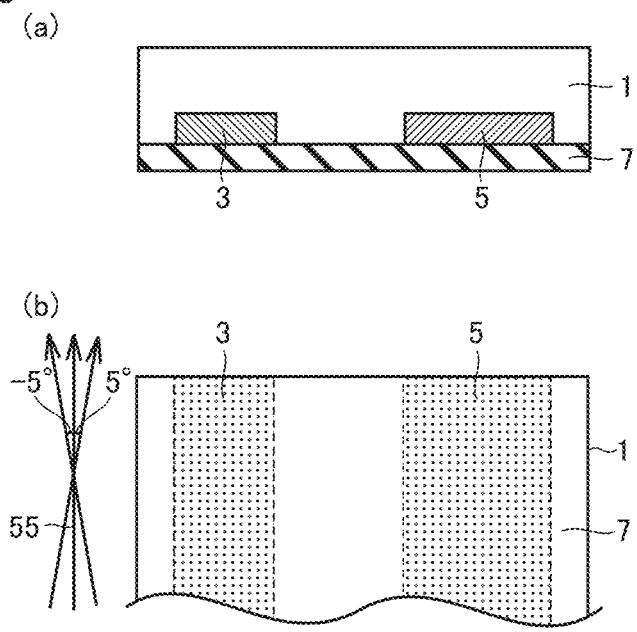
FIGS. 13(a) and 13(b) are a schematic cross-sectional view and a schematic plan view, respectively, each showing an example of the step of forming a passivation film on the back surface of the semiconductor substrate.
Figure 14:
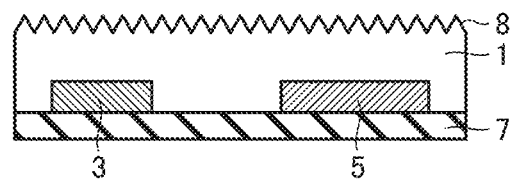
FIGS. 14(a) and 14(b) are a schematic cross-sectional view and a schematic plan view, respectively, each showing an example of the step of forming a textured structure on the light receiving surface of the semiconductor substrate.
Figure 14:
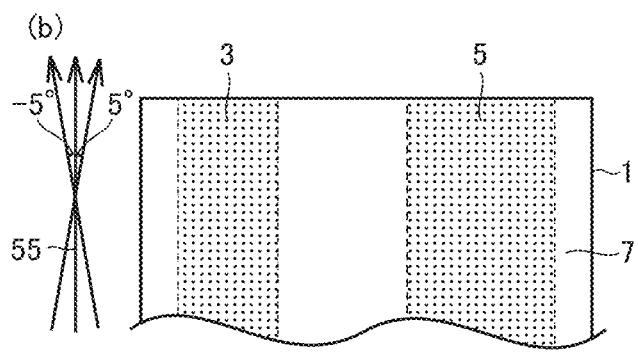
Figure 15:
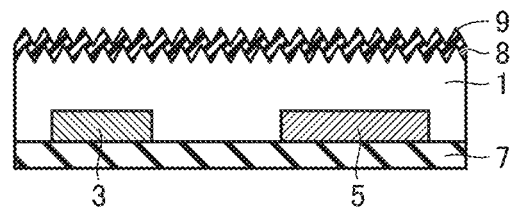
FIGS. 15(a) and 15(b) are a schematic cross-sectional view and a schematic plan view, respectively, each showing an example of the step of forming an antireflection film on the textured structure of the semiconductor substrate.
Figure 15:
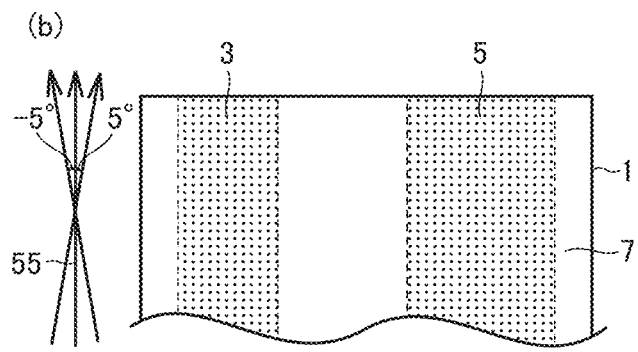
Figure 16:
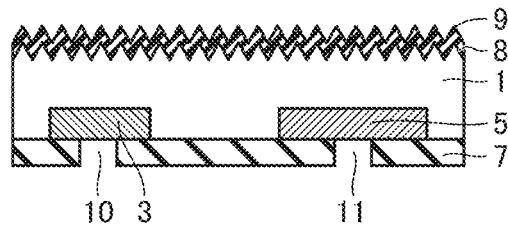
FIGS. 16(a) and 16(b) are a schematic cross-sectional view and a schematic plan view, respectively, each showing an example of the step of forming a contact hole in the passivation film on the back surface of the semiconductor substrate.
Figure 16:
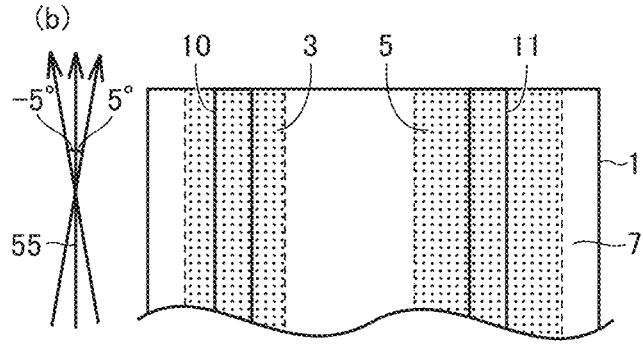
Figure 17:
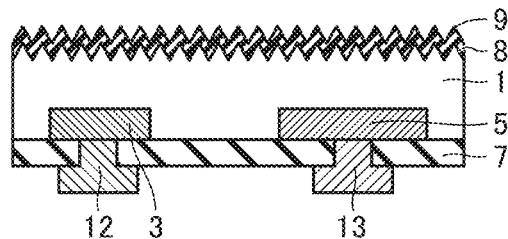
FIGS. 17(a) and 17(b) are a schematic cross-sectional view and a schematic plan view, respectively, each showing an example of the step of forming an electrode for n type and an electrode for p type.
Figure 17:
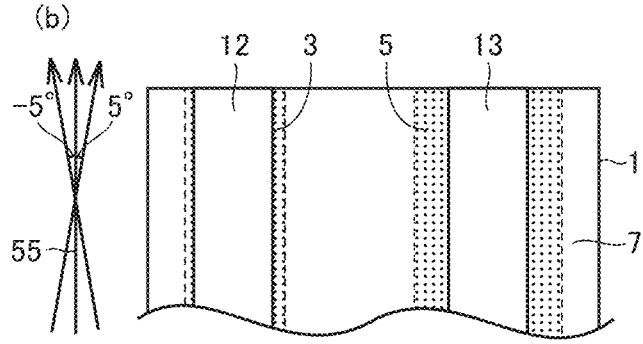

FIG. 6 shows a schematic enlarged cross-sectional view of an example of a part of the surface of semiconductor substrate 1 shown in FIG. 5. FIG. 7 shows a schematic perspective view of an example of a part of the surface of semiconductor substrate 1 shown in FIG. 5. In this case, on the surface of semiconductor substrate 1, a relatively large meandering line (an imaginary dashed line in FIG. 6; which will be hereinafter referred to as a "saw mark") 61 is formed while a groove-shaped abrasion trace 62 is formed that is less in depth than saw mark 61.

Saw mark 61 is formed due to cutting of semiconductor crystal ingot 50 using wire saw 53. In other words, as shown in FIG. 1, semiconductor substrate 1 is obtained by pressing semiconductor crystal ingot 50 against reciprocating wire saw 53, in which case, however, wire saw 53 is temporarily stopped to cause reduction in linear velocity each time a moving direction 55 of wire saw 53 is changed. This causes a difference in the depth cut into semiconductor crystal ingot 50 by wire saw 53 along the direction in which semiconductor crystal ingot 50 is moved toward wire saw 53 (the direction shown by arrow 54), which leads to occurrence of saw mark 61 emerged as a relatively large meandering line on the surface of semiconductor substrate 1.

Furthermore, abrasion trace 62 is a scratch formed by abrasive grain 53b on wire saw 53 during cutting of semiconductor crystal ingot 50 using wire saw 53, which is formed in a groove shape extending in moving direction 55 of wire saw 53.

Although not shown in FIGS. 6 and 7 for ease of explanation, a crater-shaped recess may be provided in the surface of semiconductor substrate 1 by etching performed for removing the above-described slice damage 1a.

Then, as shown in the schematic cross-sectional view in FIG. 8(a), masking paste 2 is placed on the entire surface (light receiving surface) of semiconductor substrate 1 on the light receiving surface side while masking paste 2 is placed on the surface (back surface) of semiconductor substrate 1 on the back surface side so as to have an opening 14 provided in masking paste 2.

In this case, as shown in the schematic plan view in FIG. 8(b), masking paste 2 is placed so as to have a portion extending in the direction at an angle within the range of −5° to +5° with respect to the direction in which the abrasion trace (not shown) extends (the direction shown by arrow 55). This is based on the inventors' finding obtained as a result of an earnest study, as follows. That is, in the case where masking paste 2 is placed so as to extend in the direction at an angle within the range of −5° to +5° with respect to the direction in which the abrasion trace extends, masking paste 2 can be suppressed from flowing out in the direction other than the extending direction of masking paste 2, as compared with the case where masking paste 2 is placed so as to extend in the direction at an angle beyond the above-described range. Accordingly, at least in the above-described portion of masking paste 2, opening 14 can be provided with stability in the direction at an angle within the range of −5° to +5° with respect to the direction in which the abrasion trace extends (the direction shown by arrow 55). In the present embodiment, an explanation will be given with regard to the case where masking paste 2 is formed in a strip shape extending in the direction at an angle of 0° with respect to the direction in which the abrasion trace extends (the direction shown by arrow 55).

Examples of the material for masking paste 2 may be a solvent, a thickening agent, and a silicon oxide precursor and/or a titanium oxide precursor, and furthermore, may be those not including a thickening agent.

Examples of the solvent may be ethylene glycol, methyl cellosolve, methyl cellosolve acetate, ethyl cellosolve, diethyl cellosolve, cellosolve acetate, ethylene glycol monophenyl ether, methoxy ethanol, ethylene glycol monoacetate, ethylene glycol diacetate, diethylene glycol, diethylene glycol monomethyl ether, diethylene glycol monoethyl ether acetate, diethylene glycol monobutyl ether, diethylene glycol monobutyl ether acetate, diethylene glycol dimethyl ether, diethylene glycol methyl ethyl ether, diethylene glycol diethyl ether, diethylene glycol acetate, triethyl glycol, triethylene glycol monomethyl ether, triethylene glycol monoethyl ether, tetraethylene glycol, liquid polyethylene glycol, propylene glycol, propylene glycol monomethyl ether, propylene glycol monoethyl ether, propylene glycol monobutyl ether, 1-butoxyethoxy propanol, dipropyl glycol, dipropylene glycol monomethyl ether, dipropylene glycol monoethyl ether, tripropylene glycol monomethyl ether, polypropylene glycol, trimethylene glycol, butanedial, 1,5-pentanedial, hexylene glycol, glycerin, glyceryl acetate, glycerin diacetate, glyceryl triacetate, trimethylolpropyne, 1,2,6-hexane triol, 1,2-propanediol, 1,5-pentane diol, octanediol, 1,2-butanediol, 1,4-butanediol, 1,3-butanediol, dioxane, trioxane, tetrahydrofuran, tetrahydropyran, methylal, diethyl acetal, methyl ethyl ketone, methyl isobutyl ketone, diethyl ketone, acetonylacetone, diacetone alcohol, methyl formate, ethyl formate, propyl formate, methyl acetate, and ethyl acetate, which can be used alone or in combination with two or more of them.

Although it is desirable to employ, as a thickening agent, ethyl cellulose, polyvinyl pyrrolidone or a mixture thereof, the thickening agent may be bentonite with various qualities and characteristics, a rheology additive that is generally inorganic and used for various polar solvent mixtures, cellulose nitrate and other cellulose compounds, starch, gelatin, alginic acid, highly-dispersive amorphous silicic acid (Aerosil (registered trademark)), polyvinyl butyral (Mowital (registered trademark)), sodium carboxymethyl cellulose (vivistar), thermoplastic polyamide resin (Eurelon (registered trademark)), an organic castor oil dielectric (Thixin R (registered trademark)), diamide wax (Thixatrol plus (registered trademark)), swelling polyacrylate (Rheolate (registered trademark)), polyether urea-polyurethane, polyether polyol, and the like.

Examples of the silicon oxide precursor may be substances like TEOS (tetraethyl orthosilicate) represented by a general formula $R^{1'}{}_n Si(OR^1)_{4-n}$ (wherein $R^{1'}$ represents methyl, ethyl or phenyl; $R^1$ represents methyl, ethyl, n-propyl, or i-propyl; and n represents 0, 1 or 2).

For example, in addition to $Ti(OH)_4$, the titanium oxide precursor may be substances like TPT (tetraisopropoxy titanium) represented by $R^{2'}{}_n Ti(OR^2)_{4-n}$ (wherein $R^{2'}$ represents methyl, ethyl or phenyl; $R^2$ represents methyl, ethyl, n-propyl, or i-propyl; and n represents 0, 1 or 2), and furthermore, may include $TiCl_4$, $TiF_4$, $TiOSO_4$, and the like.

When a thickening agent is used, examples thereof may be castor oil, bentonite, cellulose nitrate, ethyl cellulose, polyvinyl pyrrolidone, starch, gelatin, alginic acid, amorphous silicic acid, polyvinyl butyral, sodium carboxymethyl cellulose, a polyamide resin, an organic castor oil dielectric, diamide wax, swelling polyacrylate, polyether urea-polyurethane, polyether polyol, and the like, which can be used alone or in combination with two or more of them.

The method of placing masking paste 2 is not particularly limited, but, for example, a conventionally known coating method and the like can be used.

Masking paste 2 placed on each of the light receiving surface and the back surface of semiconductor substrate 1 is dried.

Masking paste 2 can be dried, for example, by placing semiconductor substrate 1 having masking paste 2 placed therein within an oven, and heating masking paste 2, for example, at a temperature of about 300° C., for example, for several dozen minutes.

Then, masking paste 2 that has been dried as described above is fired, and thereby solidified. Masking paste 2 can be fired by heating masking paste 2, for example, at a temperature of 800° C. or higher and 1000° C. or lower, for example, for 10 minutes or more and 60 minutes or less.

Then, as shown in the schematic cross-sectional view in FIG. 9(a), n-type dopant containing gas 4 is applied to cause the n-type dopant to be diffused in the back surface of semiconductor substrate 1 exposed through opening 14 on the back surface side of semiconductor substrate 1, thereby forming an n-type dopant diffusion region 3. Consequently, as shown in the schematic plan view in FIG. 9(b), n-type dopant diffusion region 3 is formed in a strip shape extending in the direction at an angle within the range of −5° to +5° with respect to the direction in which the abrasion trace extends (the direction shown by arrow 55). It is to be noted that examples of n-type dopant containing gas 4 may be, for example, $POCl_3$ containing phosphorus that is an n-type dopant, and the like. Furthermore, n-type dopant diffusion region 3 is higher in n-type dopant concentration than semiconductor substrate 1.

Then, masking paste 2 on each of the light receiving surface and the back surface of semiconductor substrate 1 is entirely removed. Masking paste 2 can be removed, for example, by the process such as immersing semiconductor substrate 1 having masking paste 2 placed therein in a hydrofluoric acid aqueous solution.

Then, as shown in the schematic cross-sectional view in FIG. 10(a), masking paste 2 is placed on the entire surface (light receiving surface) of semiconductor substrate 1 on the light receiving surface side while masking paste 2 is also placed on the surface (back surface) of semiconductor substrate 1 on the back surface side so as to have an opening 15 provided in masking paste 2. Opening 15 is provided at a position different from that where opening 14 is provided.

In this case, as shown in the schematic plan view in FIG. 10(b), masking paste 2 is placed to have a portion extending in the direction at an angle within the range of −5° to +5° with respect to the direction in which the abrasion trace (not shown) extends (the direction shown by arrow 55). Consequently, at least in the above-described portion of masking paste 2, opening 15 can be provided with stability in the direction at an angle within the range of −5° to +5° with respect to the direction in which the abrasion trace extends (the direction shown by arrow 55). In the present embodiment, masking paste 2 is formed in a strip shape extending in the direction at an angle of 0° with respect to the direction in which the abrasion trace extends (the direction shown by arrow 55), which will be explained below.

After drying masking paste 2 applied onto each of the light receiving surface and the back surface of semiconductor substrate 1, masking paste 2 is fired and thereby solidified.

Then, as shown in the schematic cross-sectional view in FIG. 11(a), p-type dopant containing gas 6 is applied to cause the p-type dopant to be diffused in the back surface of semiconductor substrate 1 exposed through opening 15 on the back surface side of semiconductor substrate 1, thereby forming a p-type dopant diffusion region 5. Consequently, as shown in the schematic plan view in FIG. 11(b), p-type dopant diffusion region 5 is formed in a strip shape extending in the direction at an angle within the range of −5° to +5° with respect to the direction in which the abrasion trace extends (the direction shown by arrow 55). It is to be noted that examples of p-type dopant containing gas 6 may be $BBr_3$ containing boron that is a p-type dopant, for example.

Then, as shown in the schematic cross-sectional view in FIG. 12(a) and the schematic plan view in FIG. 12(b), masking paste 2 on each of the light receiving surface and the back surface of semiconductor substrate 1 is entirely removed. Consequently, the entire light receiving surface and the entire back surface of semiconductor substrate 1 are exposed, thereby allowing exposure, in the back surface of semiconductor substrate 1, of n-type dopant diffusion region 3 and p-type dopant diffusion region 5 each having a strip shape extending in the direction at an angle within the range of −5° to +5° with respect to the direction in which the abrasion trace extends (the direction shown by arrow 55).

Then, as shown in the schematic cross-sectional view in FIG. 13(a) and the schematic plan view in FIG. 13(b), a passivation film 7 is formed on the back surface of semiconductor substrate 1. Examples of passivation film 7 may be a silicon oxide film, a silicon nitride film, or a silicon oxide film and a silicon nitride film stacked in layers, or the like. Passivation film 7 can be formed, for example, by the plasma CVD method or the like.

Then, as shown in the schematic cross-sectional view in FIG. 14(a) and the schematic plan view in FIG. 14(b), a textured structure 8 is formed by texture etching of the light receiving surface of semiconductor substrate 1 on the side opposite to the side on which passivation film 7 is formed. Texture etching for forming textured structure 8 can be performed by using passivation film 7 as an etching mask that is formed on the surface of semiconductor substrate 1 on the other side. When semiconductor substrate 1 is made of a silicon crystal substrate, texture etching can be performed by etching the light receiving surface of semiconductor substrate 1 using the etching solution obtained by heating, for example to 70° C. or higher and 80° C. or lower, the solution obtained by adding isopropyl alcohol to an alkaline aqueous solution containing, for example, sodium hydroxide, potassium hydroxide or the like.

Then, as shown in the schematic cross-sectional view in FIG. 15(a) and the schematic plan view in FIG. 15(b), an antireflection film 9 is formed on textured structure 8 of semiconductor substrate 1. Examples of antireflection film 9 may be a silicon oxide film, a silicon nitride film, or a silicon oxide film and a silicon nitride film stacked in layers, or the like. Antireflection film 9 can be formed, for example, by the plasma CVD method or the like.

Then, as shown in the schematic cross-sectional view in FIG. 16(a) and the schematic plan view in FIG. 16(b), a part of passivation film 7 is removed to form contact holes 10 and 11, thereby exposing a part of n-type dopant diffusion region 3 through contact hole 10 while exposing a part of p-type dopant diffusion region 5 through contact hole 11.

Contact holes 10 and 11 can be formed, for example, by the method using the photolithography technique to form, on passivation film 7, a resist pattern having an opening in a portion corresponding to the portion where each of contact holes 10 and 11 is provided, and then, removing passivation film 7 from the opening of the resist pattern by means of etching.

Then, as shown in the schematic cross-sectional view in FIG. 17(a) and the schematic plan view in FIG. 17(b), an electrode for n type 12 is formed that is electrically connected to n-type dopant diffusion region 3 via contact hole 10 while an electrode for p type 13 is formed that is electrically connected to p-type dopant diffusion region 5 via contact hole 11. In this case, electrode for n type 12 and electrode for p type 13 each can be an electrode, for example, made of metal such as silver. Consequently, the back electrode type solar cell in the present embodiment can be produced.

Thus, in the present embodiment, masking paste 2 can be placed so as to have a portion extending in the direction at an angle within the range of −5° to +5° with respect to the direction in which the abrasion trace extends, as described above. Accordingly, at least in this portion of masking paste 2, openings 14 and 15 each can be provided in a stable shape extending in the direction at an angle within the range of −5° to +5° with respect to the direction in which the abrasion trace extends.

Consequently, in the present embodiment, n-type dopant diffusion region 3 and p-type dopant diffusion region 5 formed in openings 14 and 15, respectively, can also be formed in the desired shape with stability, so that the resultant back electrode type solar cell can achieve excellent characteristics with stability.

Although the semiconductor crystal ingot having an n-type conductivity has been described in the above-described embodiment, the semiconductor crystal ingot may have a p-type conductivity.

Furthermore, the present invention is not limited to the back electrode type solar cell, but can also be applied to a semiconductor device including a solar cell of any configuration such as a double-sided electrode type solar cell manufactured to include a semiconductor substrate having an electrode formed on each of its light receiving surface and its back surface.

EXAMPLE

<Placement of Masking Paste>

Figure 18:
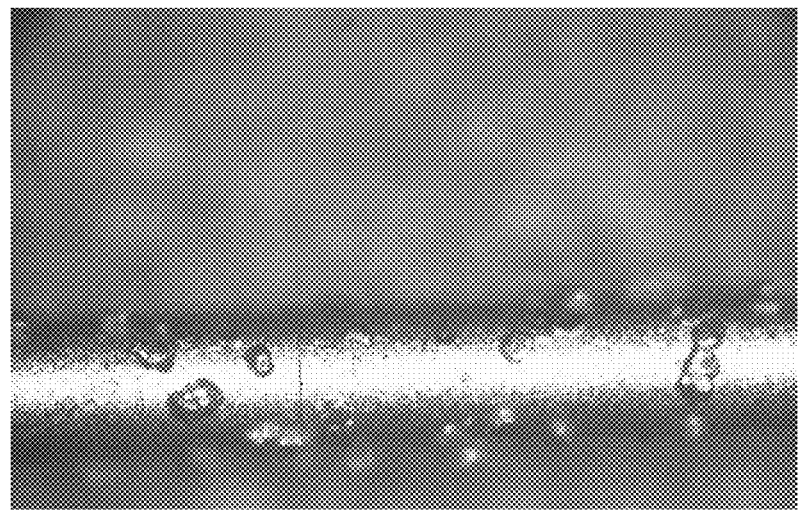
FIG. 18 is an enlarged photograph of a wire saw used in Example.

First, an n-type polycrystal silicon ingot formed by the casting method was pressed against a reciprocating wire saw (having a shape shown in the enlarged photograph in FIG. 18), and then, the ingot was cut. This causes formation of a plurality of n-type polycrystalline silicon substrates each having a thickness of 200 µm, in which an abrasion trace was formed in the form of a groove extending in one direction on the light receiving surface and the back surface each having a quasi-square shape having each side of 126 mm in length. The wire saw used in this case shown in FIG. 18 was produced by bonding diamond abrasive grains each having a grain size of 30 µm or less onto the outer surface of the piano wire having a cross-sectional diameter of 120 µm with nickel plated on this outer surface.

Figure 19:
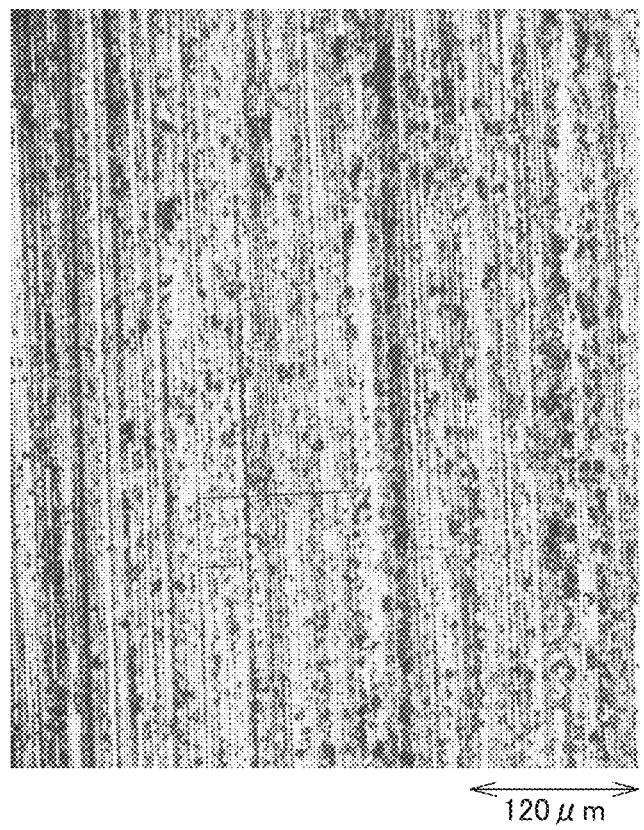
FIG. 19 is a microphotograph of an example of the surface of an n-type polycrystalline silicon substrate after being cut by the wire saw shown in FIG. 18.
Figure 20:
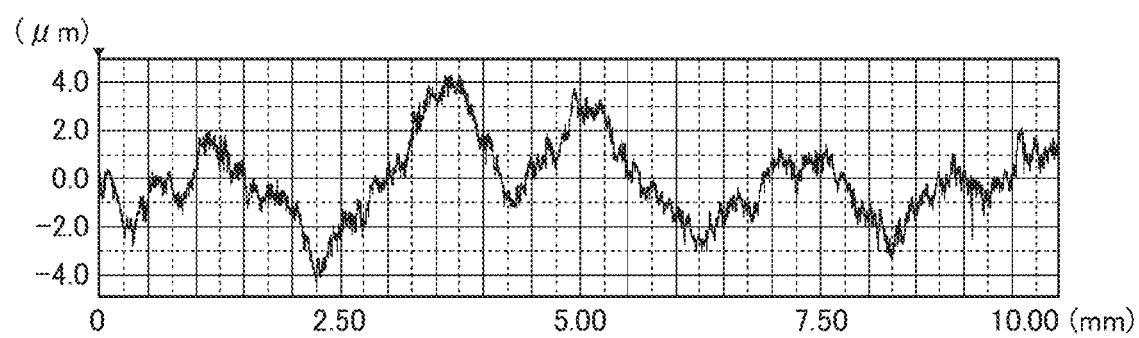
FIG. 20 is a diagram showing the result of measuring concavities and convexities on the surface of the n-type polycrystalline silicon substrate shown in FIG. 19 by a laser microscope.

FIG. 19 shows a microphotograph of an example of the surface of the n-type polycrystalline silicon substrate after being cut by the above-described wire saw. FIG. 20 shows the result of measuring concavities and convexities on the surface of the n-type polycrystalline silicon substrate shown in FIG. 19 by the laser microscope. In FIG. 20, the horizontal axis shows the width of the surface of the n-type polycrystalline silicon substrate (maximum width: 10 mm) while the vertical axis shows the thickness of the surface of the n-type polycrystalline silicon substrate (maximum thickness: 10 µm).

Figure 21:
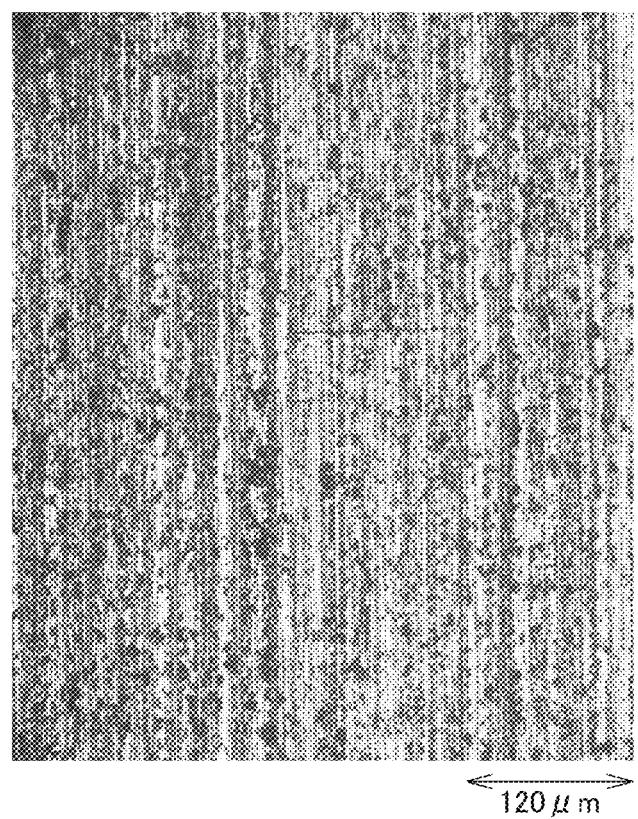
FIG. 21 is a microphotograph of another example of the surface of the n-type polycrystalline silicon substrate after being cut by the wire saw shown in FIG. 18.
Figure 22:
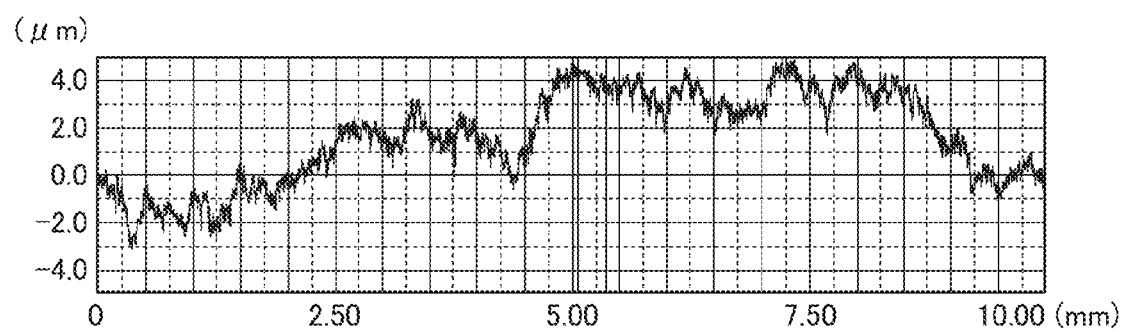
FIG. 22 is a diagram showing the result of measuring concavities and convexities on the surface of the n-type polycrystalline silicon substrate shown in FIG. 21 by the laser microscope.

FIG. 21 shows a microphotograph of another example of the surface of the n-type polycrystalline silicon substrate after being cut by the above-described wire saw. FIG. 22 shows the result of measuring concavities and convexities on the surface of the n-type polycrystalline silicon substrate shown in FIG. 21 by the laser microscope. In FIG. 22, the horizontal axis shows the width of the surface of the n-type polycrystalline silicon substrate (maximum width: 10 mm) while the vertical axis shows the thickness of the surface of the n-type polycrystalline silicon substrate (maximum thickness: 10 µm).

As shown in FIGS. 19 to 22, it was confirmed that saw marks and abrasion traces were formed on the surface of the n-type polycrystalline silicon substrate, in which case the saw marks each were a relatively large meandering line formed along the direction in which the n-type polycrystal silicon ingot was pressed against the wire saw while the abrasion traces (vertical lines in FIGS. 19 and 21) each were in the shape of a groove formed in the saw mark along the direction in which the wire saw was moved.

Then, the surface of the n-type polycrystalline silicon substrate formed as described above was etched to a depth of 30 μm by the sodium hydroxide aqueous solution having a sodium hydroxide concentration of 48 percent by mass (a ratio of sodium hydroxide 48 g to water 52 g), thereby removing the slice damage on the surface of the n-type polycrystalline silicon substrate.

Figure 23:
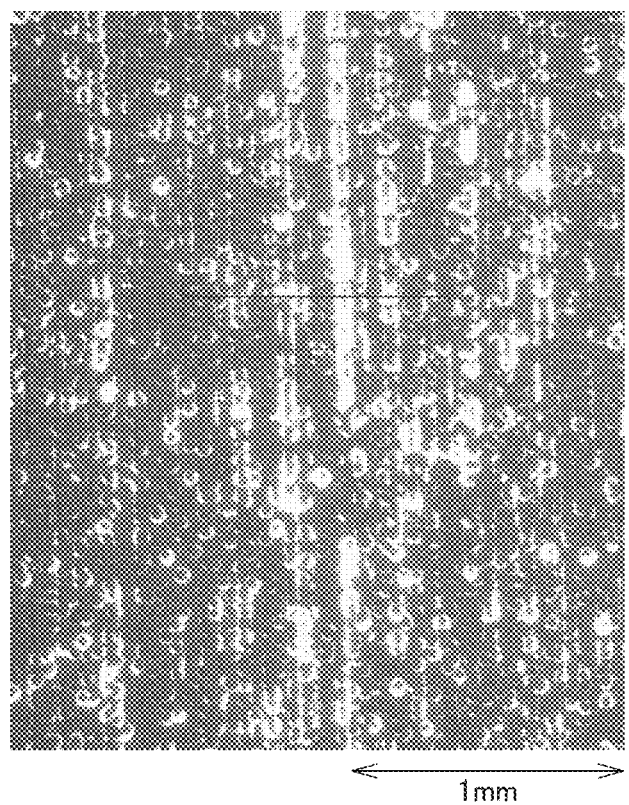
FIG. 23 is a microphotograph of an example of the etched surface of the n-type polycrystalline silicon substrate shown in FIG. 19.
Figure 24:
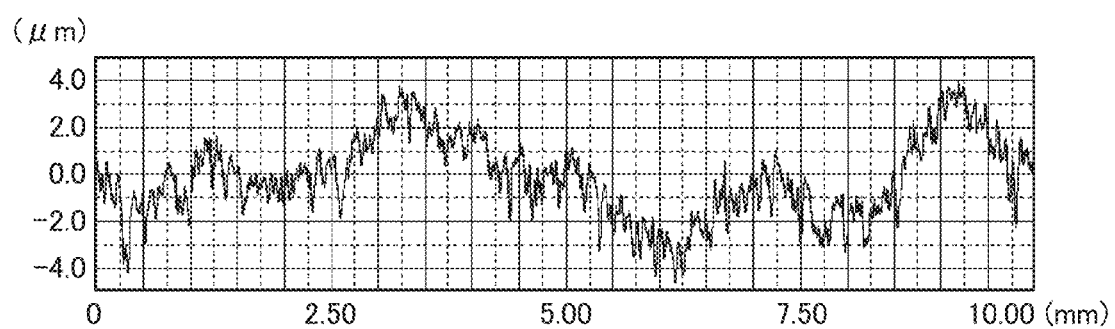
FIG. 24 is a diagram showing the result of measuring concavities and convexities on the surface of the n-type polycrystalline silicon substrate shown in FIG. 23 by the laser microscope.
Figure 25:
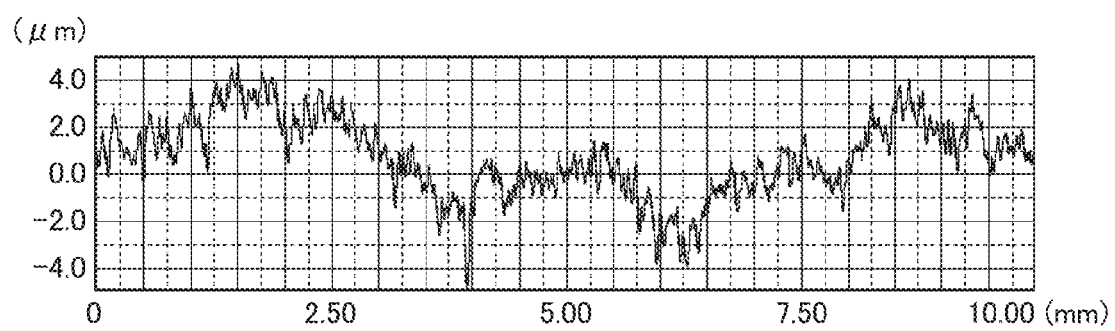
FIG. 25 is a diagram showing the result of measuring concavities and convexities on the etched surface of the n-type polycrystalline silicon substrate shown in FIG. 21 by the laser microscope.

FIG. 23 shows a microphotograph of an example of the etched surface of the n-type polycrystalline silicon substrate shown in FIG. 19. FIG. 24 shows the result of measuring concavities and convexities on the surface of the n-type polycrystalline silicon substrate shown in FIG. 23 by the laser microscope. FIG. 25 shows the result of measuring concavities and convexities on the etched surface of the n-type polycrystalline silicon substrate shown in FIG. 21 by the laser microscope. As shown in FIG. 23, circular recesses were formed on the surface of the n-type polycrystalline silicon substrate. As shown in FIGS. 24 and 25, abrasion traces did not disappear from the surface of the n-type polycrystalline silicon substrate.

Then, a plurality of strip-shaped masking pastes (design width per masking paste: 1300 μm, viscosity: 13 Pa·S) were intermittently placed on the surface of the n-type polycrystalline silicon substrate that has been etched as described above, such that the masking pastes extended in the direction at an angle within the range of −5° to +5° with respect to the direction in which the abrasion trace extended. This led to formation of a strip-shaped opening between adjacent masking pastes that corresponded to an exposed portion in which the masking paste was not placed (design width per opening: 200 μm).

Figure 26:
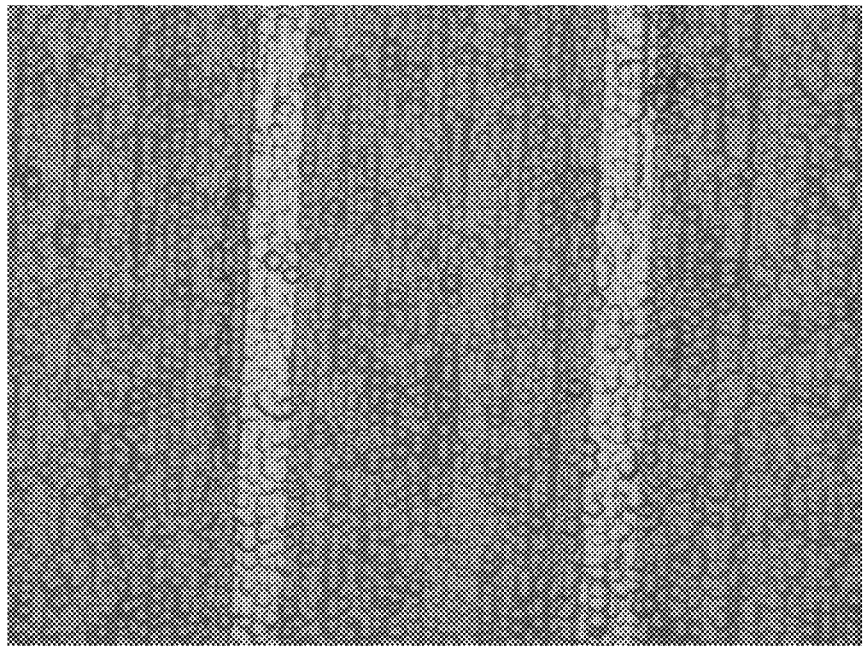
FIG. 26(a) is a microphotograph of the surface of the n-type polycrystalline silicon substrate in which masking paste is placed so as to extend in the direction at an angle within the range of −5° to +5° with respect to the direction in which an abrasion trace extends.
FIG. 26(b) is an enlargement of the microphotograph in FIG. 26(a).
Figure 26:
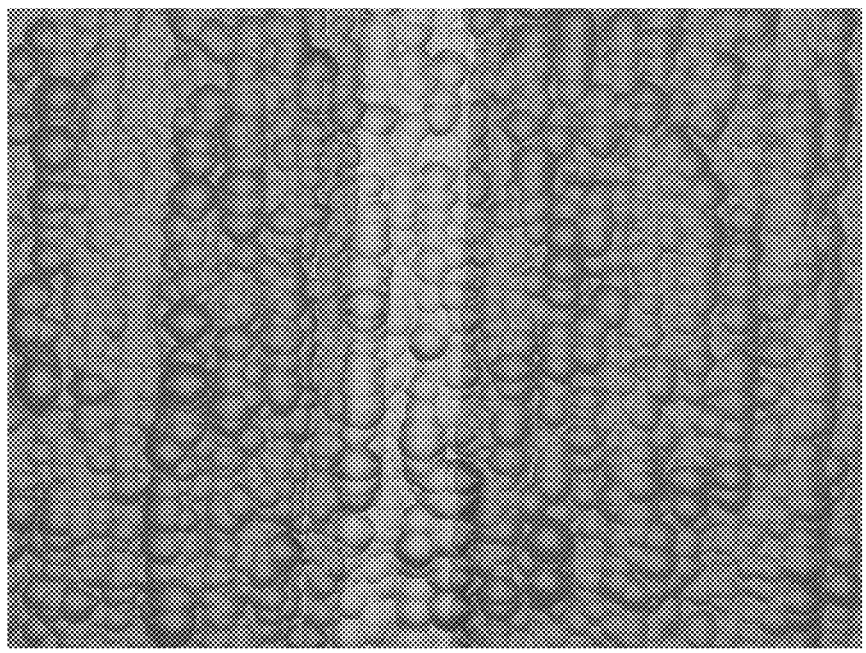

FIG. 26(a) shows a microphotograph of the surface of the n-type polycrystalline silicon substrate in which masking paste is placed so as to extend in the direction at an angle within the range of −5° to +5° with respect to the direction in which the abrasion trace extends. FIG. 26(b) shows an enlargement of the microphotograph in FIG. 26(a). In FIGS. 26(a) and 26(b), the darkly shaded portion shows an area where the masking paste is placed while the lightly shaded portion shows an opening.

As shown in FIGS. 26(a) and 26(b), in the case where the masking paste was placed so as to extend in the direction at an angle within the range of −5° to +5° with respect to the direction in which the abrasion trace extended, it was confirmed that this masking paste could be suppressed from flowing out in the direction other then that in which the masking paste extended.

The masking paste was placed in the same manner as described above, except that a plurality of pieces of strip-shaped masking paste were placed so as to extend in the direction orthogonal to the direction in which the abrasion trace extended.

Figure 27:
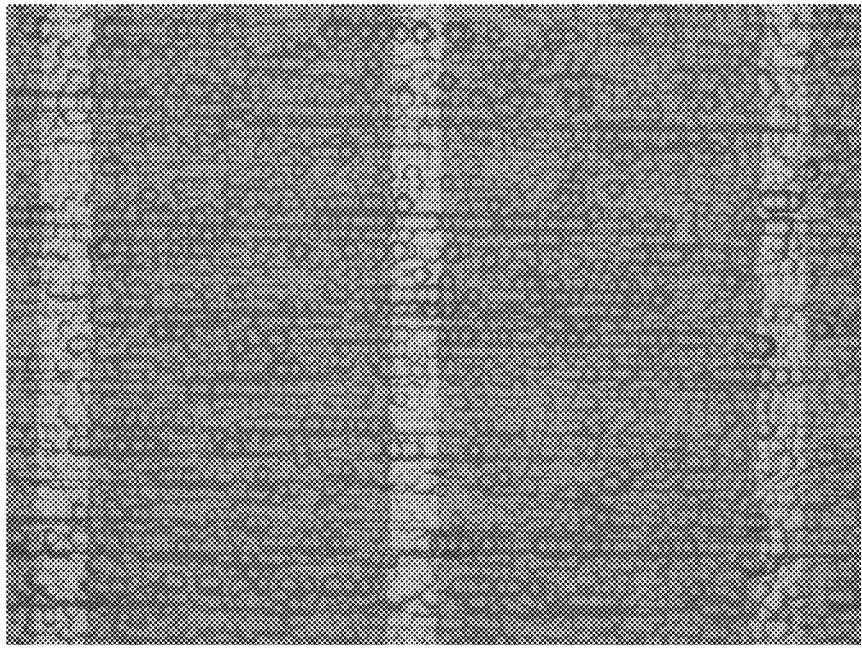
FIG. 27(a) is a microphotograph of the surface of the n-type polycrystalline silicon substrate in which masking paste is placed so as to extend in the direction orthogonal to the direction in which the abrasion trace extends.
FIG. 27(b) is an enlargement of the microphotograph in FIG. 27(a).
Figure 27:
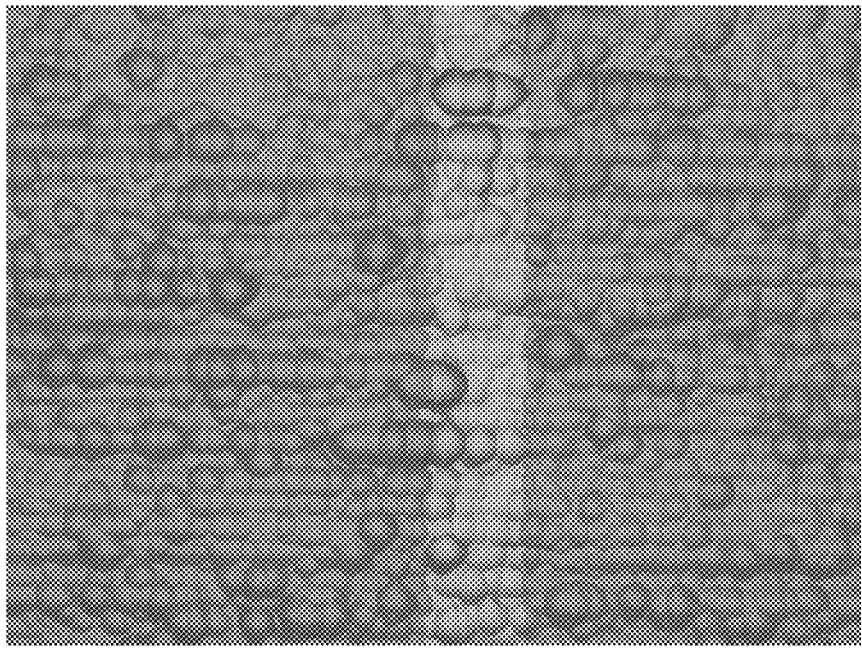
Figure 28:
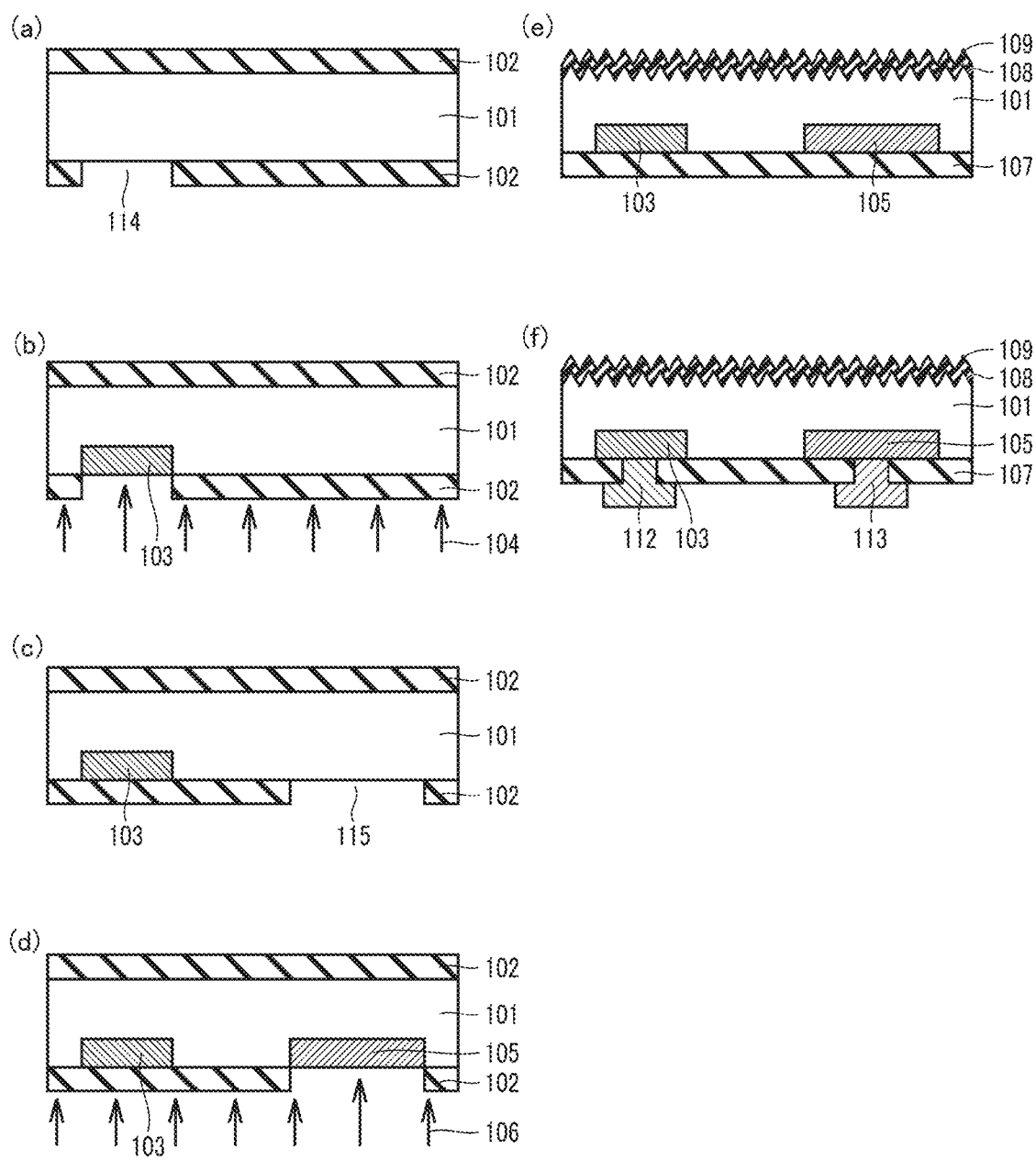
FIGS. 28(a) to (f) each are a schematic cross-sectional view illustrating an example of a method for manufacturing a conventional back electrode type solar cell.

FIG. 27(a) shows a microphotograph of the surface of the n-type polycrystalline silicon substrate in which the masking paste is placed so as to extend in the direction orthogonal to the direction in which the abrasion trace extends. FIG. 27(b) shows an enlargement of the microphotograph in FIG. 27(a). In FIGS. 27(a) and 27(b), the darkly shaded portion shows an area where the masking paste is placed while the lightly shaded portion shows an opening.

As shown in FIGS. 27(a) and 27(b), it was confirmed that, in the case of the masking paste placed so as to extend in the direction orthogonal to the direction in which the abrasion trace extended, this masking paste was likely to flow out in the direction other than the direction in which the masking paste extended, thereby leading to variations in the width of the masking paste, as compared with the case of the masking paste placed so as to extend in the direction at an angle within the range of −5° to +5° with respect to the direction in which the abrasion trace extended.

Furthermore, optional ten openings (sample numbers 1 to 10) were selected from the surface of the n-type polycrystalline silicon substrate in which the masking paste was placed so as to extend in the direction at an angle within the range of −5° to +5° with respect to the direction in which the abrasion trace extended. Then, the maximum value and the minimum value of the width of each of these ten openings were measured to calculate each difference between the maximum value and minimum value. Then, an average value and a standard deviation σ were calculated for each of the maximum values, the minimum values and the differences between their respective maximum values and minimum values that were calculated regarding the opening widths of sample numbers 1 to 10. The results thereof are shown in Table 1.

TABLE 1

| Sample No. | Maximum Value of Variations from Design Value | Minimum Value of Variations from Design Value | Difference between Maximum Value and Minimum Value |
| --- | --- | --- | --- |
| 1 | 211 | 167 | 44 |
| 2 | 203 | 160 | 43 |
| 3 | 211 | 194 | 17 |
| 4 | 219 | 202 | 17 |
| 5 | 225 | 189 | 36 |
| 6 | 222 | 178 | 44 |
| 7 | 218 | 160 | 58 |
| 8 | 224 | 168 | 56 |
| 9 | 228 | 186 | 42 |
| 10 | 199 | 171 | 28 |
| Average Value | 216 | 178 | 38 |
| σ | 10 | 15 | 14 |

Table 1 shows average values and standard deviations σ for each of the maximum values, the minimum values and the differences between their respective maximum values and the minimum values that were calculated regarding the opening widths of samples numbers 1 to 10, in which the average values of the maximum values, the minimum values and the differences are 216, 178 and 39, respectively, while the standard deviations σ of the maximum values, the minimum values and the differences are 10, 15 and 14, respectively.

Optional ten openings were selected from the surface of the n-type polycrystalline silicon substrate in which the masking paste was placed so as to extend in the direction orthogonal to the direction in which the abrasion trace extended. Then, the maximum value and the minimum value of the width of each of these ten openings (sample numbers 11 to 20) were measured to calculate each difference between the maximum value and the minimum value. Then, an average value and a standard deviation σ were calculated for each of the maximum values, the minimum values and the differences between their respective maximum values and minimum values that were calculated regarding the opening widths of sample numbers 11 to 20. The results thereof are shown in Table 2.

TABLE 2

| Sample No. | Maximum Value of Variations from Design Value | Minimum Value of Variations from Design Value | Difference between Maximum Value and Minimum Value |
|---|---|---|---|
| 11 | 222 | 139 | 83 |
| 12 | 205 | 163 | 42 |
| 13 | 198 | 135 | 63 |
| 14 | 210 | 91 | 119 |
| 15 | 211 | 157 | 54 |
| 16 | 245 | 141 | 104 |
| 17 | 256 | 197 | 59 |
| 18 | 225 | 173 | 52 |
| 19 | 219 | 169 | 50 |
| 20 | 195 | 155 | 40 |
| Average Value | 219 | 152 | 67 |
| σ | 20 | 28 | 27 |

Table 2 shows average values and standard deviations σ for each of the maximum values, the minimum values and the differences between their respective maximum values and the minimum values that were calculated regarding the opening widths of sample numbers 11 to 20, in which the average values of the maximum values, the minimum values and the differences are 219, 152 and 67, respectively, while the standard deviations σ of the maximum values, the minimum values and the differences are 20, 28 and 27, respectively.

Therefore, as shown in Tables 1 and 2, it was confirmed that, in the case where the masking paste was placed so as to extend in the direction at an angle within the range of −5° to +5° with respect to the direction in which the abrasion trace extended, variations from the design value of the width of the masking paste could be suppressed, as compared with the case where the masking paste was placed so as to extend in the direction orthogonal to the direction in which the abrasion trace extended.

<Production and Evaluation of Back Electrode Type Solar Cell>

A back electrode type solar cell was produced using an n-type polycrystalline silicon substrate having openings of sample numbers 1 to 10 (the substrate in Example) and an n-type polycrystalline silicon substrate having openings of sample numbers 11 to 20 (the substrate in Comparative Example).

Specifically, a masking paste was first placed on the entire surface of the substrate in each of Example and Comparative Example on the side opposite to the side on which the masking paste was placed. Then, the substrate in each of Example and Comparative Example was placed within the oven and heated at 150° C. for 30 minutes, thereby drying the masking paste.

Then, the masking paste dried as described above was heated at 800° C. for 40 minutes and then fired, thereby solidifying the masking paste.

Then, POCl$_3$ was applied to the substrate in each of Example and Comparative Example obtained after solidifying the masking paste, thereby causing phosphorus to be diffused in the above-described openings in the substrate in each of Example and Comparative Example, so that an n-type dopant diffusion region was formed.

Then, the substrate in each of Example and Comparative Example was immersed in the hydrofluoric acid aqueous solution, thereby entirely removing the masking paste on the substrate in each of Example and Comparative Example.

Then, the masking paste was placed on the surface on which the n-type dopant diffusion region was formed, so as to have a plurality of openings through which the region different from the n-type dopant diffusion region was exposed in a strip shape extending in parallel to the n-type dopant diffusion region. In the case of the substrate in Example, the masking paste was placed so as to extend in the direction at an angle within the range of −5° to +5° with respect to the direction in which the abrasion trace extended. In the case of the substrate in Comparative Example, the masking paste was placed so as to extend in the direction orthogonal to the direction in which the abrasion trace extended.

Furthermore, the masking paste was placed also on the entire surface of the substrate in each of Example and Comparative Example on the side opposite to the side on which the n-type dopant diffusion region was formed.

Then, the substrate in each of Example and Comparative Example was placed within the oven, and heated at 150° C. for 30 minutes to dry the masking paste, which was then heated at 800° C. for 40 minutes and fired, thereby solidifying the masking paste.

Then, BBr$_3$ was applied to the substrate in each of Example and Comparative Example, to cause boron to be diffused in the above-described openings in the substrate in each of Example and Comparative Example, thereby forming a p-type dopant diffusion region.

Then, the substrate in each of Example and Comparative Example was immersed in the hydrofluoric acid aqueous solution, thereby entirely removing the masking paste on the substrate in each of Example and Comparative Example.

Then, a passivation film made of a silicon nitride film was formed by the plasma CVD method on the entire surface of the substrate in each of Example and Comparative Example on the side on which the n-type dopant diffusion region and the p-type dopant diffusion region were formed.

Then, a textured structure was formed by texture etching of the surface of the substrate in each of Example and Comparative Example on the side opposite to the side on which the passivation film was formed. In this case, texture etching was performed using an etching solution at a temperature of 70° C. to 80° C. obtained by adding isopropyl alcohol to the sodium hydroxide aqueous solution having a sodium hydroxide concentration of 3 percent by mass.

Then, an antireflection film made of a silicon nitride film was formed by the plasma CVD method on the textured structure of the substrate in each of Example and Comparative Example.

Then, a part of the passivation film on the substrate in each of Example and Comparative Example was removed in a strip shape, thereby providing a contact hole, to expose a part of each of the n-type and p-type dopant diffusion regions.

Subsequently, a commercially available silver paste was applied so as to fill the contact hole in the substrate in each of Example and Comparative Example. Then, the silver paste was dried, and heated at 600° C. for 20 minutes and thereby fired, so that a silver electrode was formed that was in contact with each of the n-type dopant diffusion region and the p-type dopant diffusion region. Thus, a back electrode type solar cell including a substrate in each of Example and Comparative Example was produced.

Then, a solar simulator was used to apply quasi-sunlight to the back electrode type solar cell produced using the substrate in Example (a solar cell in Example) and the back electrode type solar cell produced using the substrate in Comparative Example (a solar cell in Comparative Example), to measure current-voltage (IV) characteristics, and measure the short-circuit current density, the open-circuit voltage, the F.F. (Fill Factor), the conversion efficiency, and the leakage current. The results thereof are shown in Table 3. In Table 3, the values of the short-circuit current density, the open-circuit voltage, the F.F., the conversion efficiency, and the leakage current of the solar cell in Example are represented by relative values, respectively, based on the values of the short-circuit current density, the open-circuit voltage, the F. F., the conversion efficiency, and the leakage current of the solar cell in Comparative Example, which each are set at 100.

TABLE 3

| | Short-Circuit Current Density | Open-Circuit Voltage | F.F. | Conversion Efficiency | Leakage Current |
|---|---|---|---|---|---|
| Example | 100 | 100 | 106 | 106 | 21 |
| Comparative Example | 100 | 100 | 100 | 100 | 100 |

As shown in Table 3, when comparing the solar cell in Example with the solar cell in Comparative Example, it was confirmed that the solar cell in Example was equal in short-circuit current density and open-circuit voltage to the solar cell in Comparative Example, but higher in F.F. and conversion efficiency and lower in leakage current than the solar cell in Comparative Example. Therefore, the solar cell in Example can achieve excellent characteristics with stability as compared with the solar cell in Comparative Example.

It is considered this is because the solar cell in Example can be configured to have an n-type dopant diffusion region and a p-type dopant diffusion region formed with stability in a strip shape extending in the direction at an angle within the range of −5° to +5° with respect to the direction in which the abrasion trace extends, which allows reduced variations in the width of each of the n-type dopant diffusion region and the p-type dopant diffusion region, as compared with the solar cell in Comparative Example.

It should be understood that the embodiments and examples disclosed herein are illustrative and non-restrictive in every respect. The scope of the present invention is defined by the terms of the claims, rather than the description above, and is intended to include any modifications within the scope and meaning equivalent to the terms of the claims.

INDUSTRIAL APPLICABILITY

The present invention can be applied to a semiconductor device and a method for manufacturing the semiconductor device, and particularly, suitably applied to a back electrode type solar cell and a method for manufacturing the back electrode type solar cell.

REFERENCE SIGNS LIST 1, 101 semiconductor substrate,
1a slice damage,
2, 102 masking paste,
3, 103 n-type dopant diffusion region,
4, 104 n-type dopant containing gas,
5, 105 p-type dopant diffusion region,
6, 106 p-type dopant containing gas,
7, 107 passivation film,
8, 108 textured structure,
9, 109 antireflection film,
10, 11 contact hole,
12, 112 electrode for n type,
13, 113 electrode for p type,
14, 15, 114, 115 opening,
50 semiconductor crystal ingot,
51, 52 guide roller,
53 wire saw,
53a core wire,
53b abrasive grain,
54, 55 arrow,
61 saw mark,
62 abrasion trace.

The invention claimed is:

1. A semiconductor device comprising:
a semiconductor substrate; and
a dopant diffusion region provided in one surface of said semiconductor substrate,
said semiconductor substrate having an abrasion trace formed on said surface thereof, and
said dopant diffusion region having a portion extending in a direction at an angle within a range of −5° to +5° with respect to a direction in which said abrasion trace extends.

2. The semiconductor device according to claim 1, wherein said dopant diffusion region includes an n-type dopant diffusion region and a p-type dopant diffusion region, and
said semiconductor device further comprises
an electrode for n type disposed on said n-type dopant diffusion region, and
an electrode for p type disposed on said p-type dopant diffusion region.

3. The semiconductor device according to claim 1, wherein said abrasion trace is a scratch formed by an abrasive grain on a wire saw.

4. The semiconductor device according to claim 1, wherein said abrasion trace has a groove shape.

* * * * *